United States Patent [19]
Amer

[11] Patent Number: 6,141,289
[45] Date of Patent: Oct. 31, 2000

[54] STRUCTURE OF RANDOM ACCESS MEMORY FORMED OF MULTIBIT CELLS

[75] Inventor: Maher Amer, Ottawa, Canada

[73] Assignee: Mosaid Technologies Incorporated, Kanata, Canada

[21] Appl. No.: 09/277,828

[22] Filed: Mar. 29, 1999

[30] Foreign Application Priority Data

Oct. 30, 1998 [CA] Canada ................................. 2253128

[51] Int. Cl.[7] ................................................. G11C 5/06
[52] U.S. Cl. ................................. 365/230.05; 365/156
[58] Field of Search .......................... 365/230.05, 154, 365/156

[56] References Cited

U.S. PATENT DOCUMENTS

| | | | |
|---|---|---|---|
| 5,754,468 | 5/1998 | Hobson | 365/230.05 |
| 5,764,588 | 6/1998 | Nogami et al. | 365/230.05 |
| 5,946,261 | 8/1999 | Artieri | 365/230.05 |
| 6,046,930 | 4/2000 | Ciraula et al. | 365/230.05 |

*Primary Examiner*—Son T. Dinh
*Attorney, Agent, or Firm*—Pascal & Associates

[57] ABSTRACT

The invention is an integrated circuit data storage array with storage cells disposed in an array of rows and columns with each cell having a number of subcells. The physical location of the subcells substantially reduces the space taken by horizontal data line used for accessing columns. This is accomplished by locating subcells of the same row number, the same bit number, and different column number adjacent to each other in the horizontal direction. As a result, a horizontal data line only extends between adjacent subcells and significantly reduces the wasted layout of multibit horizontal data lines.

10 Claims, 4 Drawing Sheets

STRUCTURE OF RANDOM ACCESS MEMORY FORMED OF MULTIBIT CELLS

FIELD OF THE INVENTION

This invention relates to the field of integrated circuit (IC) memories, and in particular to an interconnection structure in a random access memory formed of an array of multibit cells, which is useful for image processing.

BACKGROUND TO THE INVENTION

A type of IC memory used in image processing is a static random access memory (SRAM) which can be used to orthogonally transpose an array of bits used to form an image. An efficient form of this memory is described in U.S. Pat. No. 4,736,442 invented by Cary D. Kornfeld, which is incorporated by reference herein. A description of part of that memory is summarized below and is reproduced in FIG. 1 herein.

Turning to FIG. 1, the memory is formed of a matrix of cells (0,0) . . . (8,8), wherein the first numeral designates rows of the matrix and the second numeral designates the columns of the matrix. The number of cells in the matrix is (9×9).

In order to write to the memory, data is applied via write drivers 3 to data lines 5 which are equal in number to the number of columns of cells. Each data line passes through columns of cells and is coupled to a port of each cell of that column.

Row select signals are applied via decoded row address lines 7 to the rows of cells. For a row write operation, a row select signal is applied to the corresponding addressed row of cells, and the data carried by the data lines 5 is written into and latched by the corresponding cells. For a row read operation, a row select signal is applied to the corresponding addressed row, and data from the cells is read out onto the data bus 5 and then sensed by the data bus sense amplifiers 6.

To read the data out of the memory in a direction orthogonal to the direction of writing, another set of data lines 9 running horizontally adjacent to rows of the matrix of cells, is used. Each of the lines 9 is coupled to a second port of each of a corresponding row of cells. Columns of cells, i.e. one cell of each row, are enabled to be read out to the lines 9 by means of column select signals applied to column select lines 11, which are derived from decoded column address signals.

It is also desired in this type of prior art memory to be able to load addressed columns of cells, in addition to addressed rows of cells as in the structure already described. This could be accomplished by separately driving and sensing data lines 9, which would be loaded with the data and once the desired column is enabled using the column enable lines 11, a column of data would be written into and latched in a column of cells. However, in order to avoid adding the associated multiple drivers and sense amplifiers (not shown), it is a feature of the invention described in the aforenoted patent that the column data is applied to the same data lines 5 as is used to load row data. By connecting the data lines 5 which pass through columns of cells, to the data lines 9 along a diagonal (as shown in FIGS. 4a and 4b of the aforenoted patent), data lines 5 can be used to load data for storage in rows of cells or for storage in columns of cells. The diagonal interconnection points of data lines 5 and 9 are shown as elements a, b, c, . . . i in FIG. 1 herein.

In operation, in general, a row select line 7 enables the first port and a column selection line 11 enables the second port. To load data into a column of cells, data is applied to data lines 5. This data is transferred via the diagonal connections a, b, c, . . . i to respective horizontally illustrated data lines 9. The data thus appears at the second port of the corresponding cells. A column of cells is then enabled by means of a column select line 11, and the corresponding column of cells latches the data which appears at the selected second ports of the column of cells.

Reading data from a column proceeds in a similar manner as writing, except that the data is read out of the rows or columns of cells via the diagonal connections to read amplifiers 6.

The above structure operates adequately for storing one bit per cell. However, in the case of multiple bits per cell, a significant practical problem is encountered. To understand this problem, a relatively simple example of a 2 by 2 cell array is illustrated in FIG. 2, in which each cell is comprised of 4 subcells, i.e. to store 4 bits per cell. A more complex design for implementing pixel data, for example, would have an array of 8×8 cells, with each cell storing 16 bits and thus requiring 16 subcells.

Each subcell in FIG. 2 is identified by a three digit number a/b/c contained within the subcell block shown, wherein a represents the row number, b represents the column number, and c represents the bit number. Hence cell 1/2/3 represents the fourth subcell in the third column of the second row; all rows, columns and bits start at 0. The more common term "bit" will be used interchangeably with subcell in the description below.

No address select signals or other control signals are shown in FIG. 2. For simplicity, only the orthogonal data paths are shown.

In order to write or read rows, 8 row data lines are required, which are shown as R(0)–R(7). The row data lines run through subcells of similar bit numbers and similar column numbers. For example, data line R(0) runs through subcells 0/0/0 and 1/0/0 (subcells having bit number 0 and column number 0), data line R(3) runs through subcells 0/0/3 and 1/0/3 (subcells having bit number 3 and column number 0), data line R(5) runs through subcells 0/1/1 and 1/1/1 (subcells having bit number 1 and column number 1), etc. The row data lines are arranged in two sets of 4 bits each (e.g. R(0)–R(3) and R(4)–R(7)). It should be noted that each row data line is actually formed of two separate conductors, since complementary pairs are typically used, i.e. RDL(0) and /RDL(0) for example.

The row data lines R(7:0) can run as illustrated vertically, since the data can be placed on a particular row data line and then a particular row can be enabled to have the data written into the subcells corresponding to the row data line, of that particular row. This works because adjacent subcells in the vertical direction all belong to different rows (the subcell row number designation a). Therefore all subcells in the vertical direction can share the same row data line pair.

However, to be able to write to columns, adjacent subcells in the horizontal direction of a particular cell have the same column number b, prohibiting the use of common horizontal data buses. In this subcell implementation, a column is four subcells wide, as indicated by the 'b' value in each subcell's notation. Therefore, column data lines must run as illustrated horizontally the whole width of the array, in this example consisting of only two columns, in order to deliver data to the corresponding subcells in the different columns.

Thus for example, the column data line C(0) is coupled to subcells in the first row which have the same row number (0) and the same bit number (1), i.e. to subcells 0/0/0 and 0/1/0.

Column data line C(3) is horizontally coupled to subcells 0/0/3 and 0/1/3, column data line C(6) is horizontally coupled to subcells 1/0/2 and 1/1/2, etc. In this case as well, each of the column data lines is typically comprised of a complemetary pair of leads.

Thus for the above example of an array of 2 rows×2 columns×4 bits per column, 8 column data lines must be used, (4 for the first row and 4 for the second row), i.e. 16 lines in total which are required to extend the width of the array. The above example has used a simplified array made up of only 2×2×4 for explanatory purposes.

In the more complex 8×8×16 bit application mentioned above, the memory would require 128 columns, each consisting of 16 bits, i.e. 256 horizontal column data lines would be required to pass along the entire width of the array. This huge number of lines would make the vertical dimension of the array greatly dependent on the data line width, rather than more dependent on the sum of the heights of the storage cells, leading to an inefficient use of space on the integrated circuit layout.

In the aforementioned prior art patent, a cell consisted of only one bit and there were no subcells. As a result, horizontally adjacent cells shared a common row but not a common column as in the case in the multibit cell also described above. Since in the former case the cells only have one bit per cell, the horizontal column data lines of the multibit cells are not required, and hence the additional area taken up by horizontal data lines would not be an issue.

However, in the more complex application described above, because of the multibit cell requirement, the bus saving structure described in the aforenoted patent cannot be used. A need therefore arises for addressing column data line access for multibit cell applications.

SUMMARY OF THE INVENTION

The present invention is a structure which can be used in an orthogonal multibit cell storage array which substantially reduces the space taken by horizontal data lines used for accessing columns. This is accomplished by locating subcells of the same row number, the same bit number and different column number adjacent to each other in the horizontal direction. As a result, a horizontal data line need only extend between adjacent subcells, thereby significantly reducing the wasted layout of multibit horizontal data lines as described above.

More particularly, in accordance with an embodiment of the invention an integrated circuit data storage array comprises plural storage cells disposed in an array of rows and columns, each cell being comprised of plural subcells, each subcell for storing a bit designated by a row number, a column number and a bit number; subcells of each cell being physically located adjacent each other in positions such that horizontally adjacent subcells differ only in column number and vertically adjacent subcells differ only in row number.

In accordance with another embodiment, a data storage array is comprised of a plurality of storage cells disposed in an array of rows and columns, each storage cell of said plurality of storage cells being comprised of a plurality of subcells, each subcell of said plurality of subcells comprising a single binary bit of stored data designated within said array by a row number, a column number and a bit number, said array further comprising: (a) a plurality of row data lines coupled to each of said subcells for reading and writing data from and to each of said subcells respectively; (b) a plurality of horizontal data lines coupled to each of said subcells for reading and writing data from and to each of said subcells respectively; (c) a plurality of column data lines coupled to each of said subcells for writing data to each of said subcells.

In accordance with another embodiment, a method of simultaneously reading and writing different columns of data in an orthogonal storage array is comprised of rows and columns of cells wherein each cell in each column is comprised of a plurality of subcells, comprising the following steps: (a) transferring data from a multi-bit bus to a plurality of single-bit column data lines; (b) selecting a first column of cells in response to receipt of a first column select signal; (c) enabling a first data transfer port of each of said subcells within said first column for transferring data from said column data lines to said selected column; (d) selecting a second column of cells in response to a second column select signal; and (e) enabling a second data access port of each of the subcells within said second column via a plurality of horizontal data lines coupling all subcells within said second column having a similar bit location for transferring data from said horizontal data lines to said row data lines; steps (b), (c), (d) and (c) being performed substantially simultaneously.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
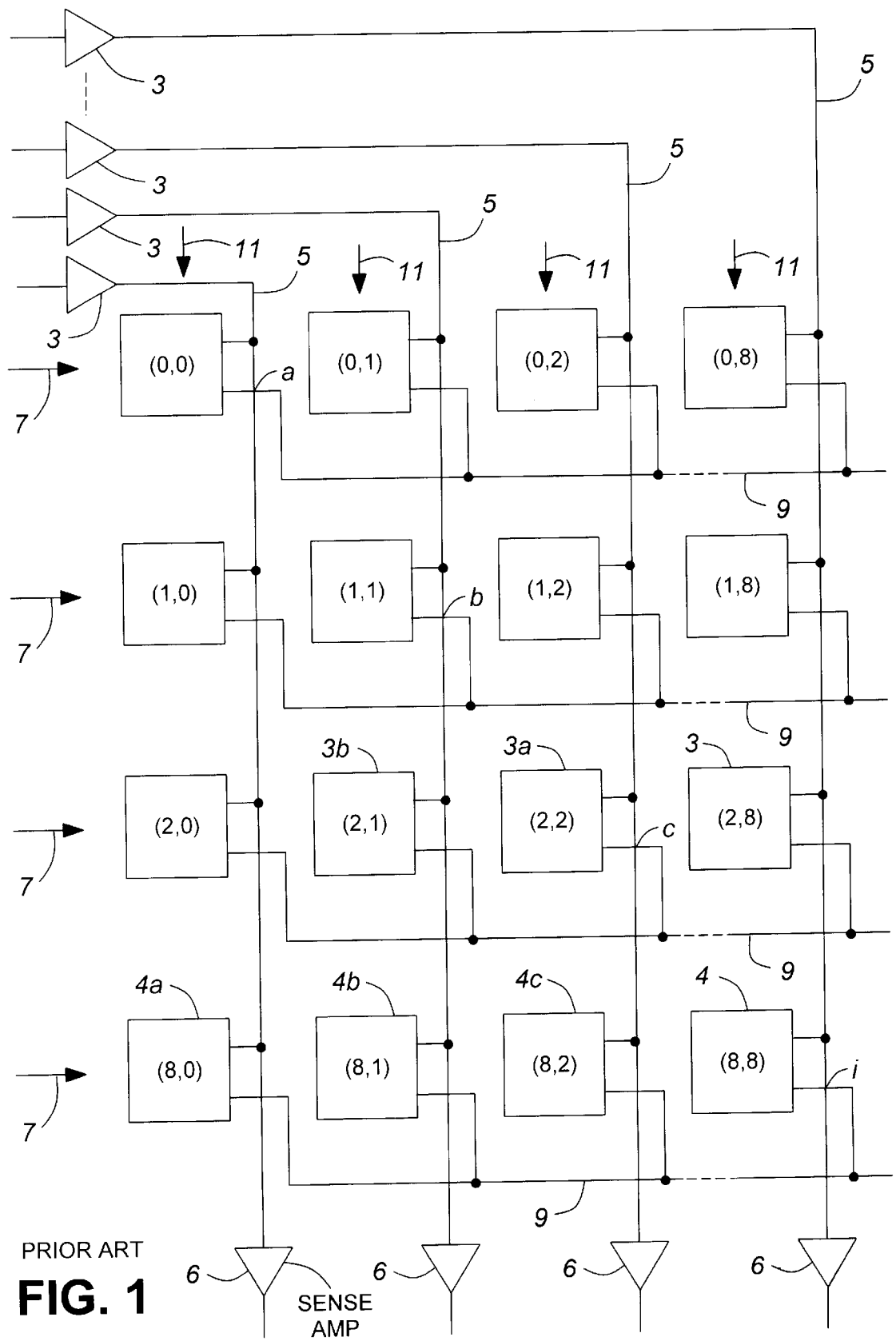
FIG. 1 is a block diagram of data storage array consisting of single-bit-per-cell storage elements in accordance with the prior art.
Figure 2:
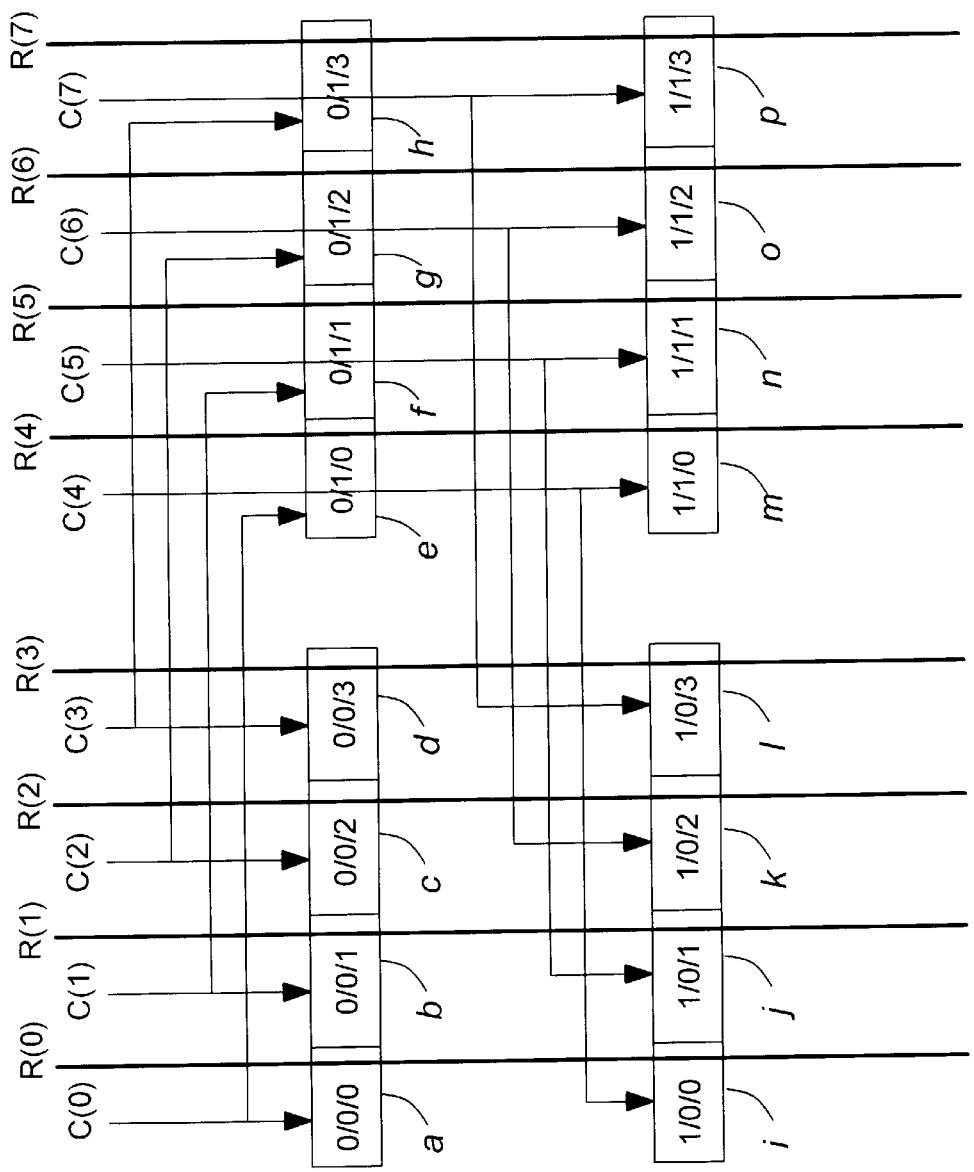
FIG. 2 is a block diagram of a multiple bit per cell array which illustrates a problem solved by the present invention.
Figure 3:
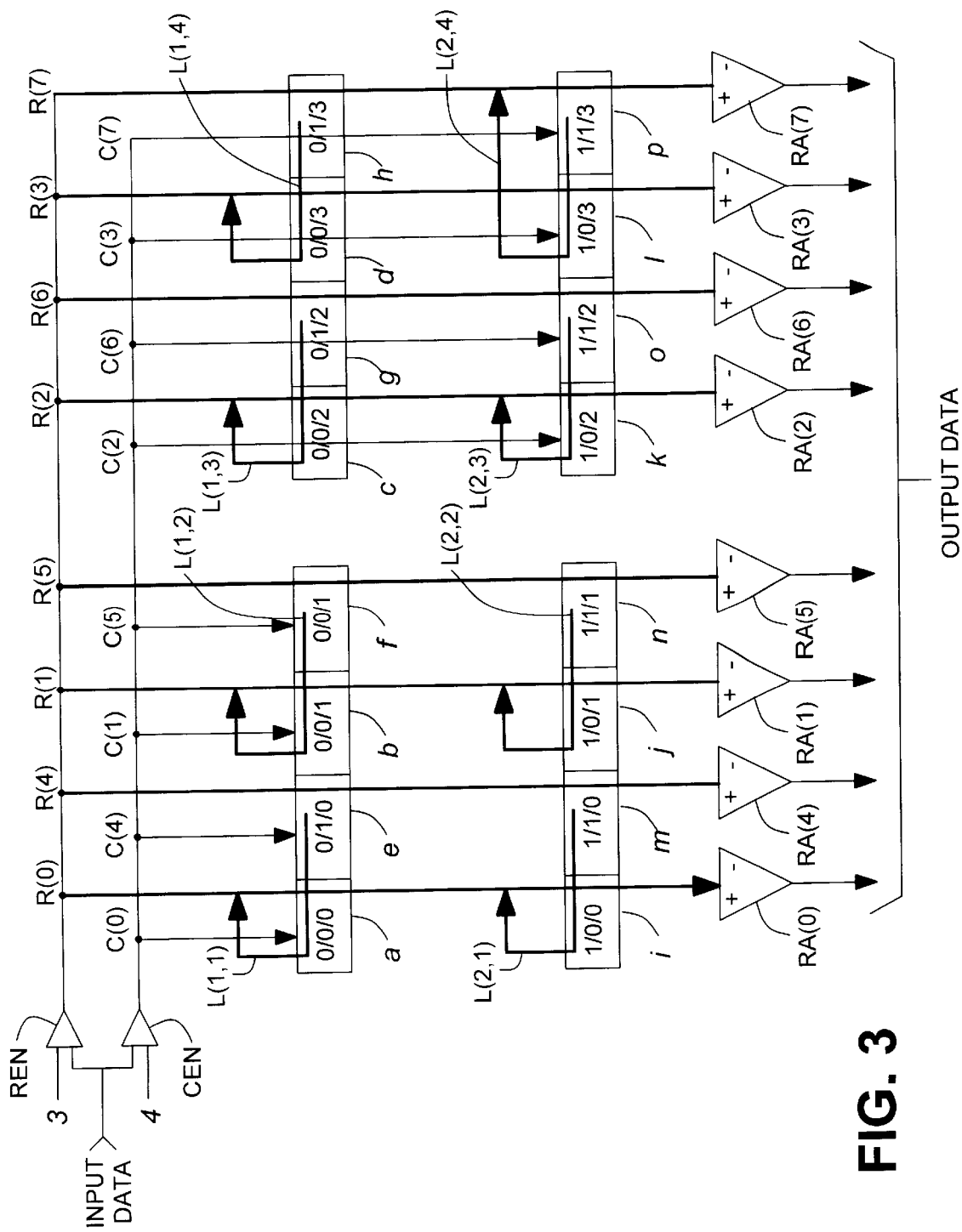
FIG. 3 is a block diagram of a multiple bit per cell array in accordance with an embodiment of the present invention.

Reference is now made to FIG. 3, and in particular to the subcell positioning relative to that of FIG. 2. FIG. 3 illustrates a 2×2 cell array, with each cell being comprised of 4 subcells, which represents the same array size example as described above with reference to FIG. 2.

In accordance with an embodiment of the present invention, all subcells sharing a common row and having the same bit number, but a different column number, are physically positioned adjacent to each other in the horizontal direction. All horizontally adjacent subcells therefore can share a common data line. For example, the first subcell in each of the two cells in the first row, i.e. 0/0/0 and 0/1/0, designated as subcells a and e in FIG. 2, are placed adjacent each other as illustrated in FIG. 3. Similarly, subcells b and f from FIG. 2 (0/0/1) and (0/1/1) respectively are located adjacent each other as shown in FIG. 3.

As a result, the horizontal data lines of FIG. 2 extending over the multiple cells can now be dedicated to extending over only a single multibit cell as shown in FIG. 3. This single cell dedication allows an important area savings feature: the horizontal data lines are arranged horizontally adjacent to each other as indicated by L (1,1) and L (1,2) in FIG. 3. There is no vertical stacking of the horizontal data lines as in FIG. 2.

In general, subcells of the same row number, the same bit number and different column numbers are located adjacent each other. Since the cells each have 4 subcells, they are arranged in a 2×2 cell array, each cell having 4 subcells, but with the cell identities as shown in FIG. 3.

The row data lines are also rearranged to match the location of the column of the respective subcells. For example, as shown in FIG. 3, the first row data line R(0) passes through subcells 0/0/0 and 1/0/0 (which have the same column number b=0). The next row data bus R(4) passes through subcells 0/1/0 and 1/1/0 (b=1), wherein it will be noticed that subcells 0/1/0 and 1/1/0 were cells e, m located in the second column in FIG. 2 and are now located as e and m in the second column which is physically located next to the first column.

Similarly, row data bus R(1) passes through subcells 0/0/1 and 1/0/1 b and j respectively, row data bus R(5) passes through subcells 0/1/1 and 1/1/1 f and n respectively, row data bus R(2) passes through subcells 0/0/2 and 1/0/2 c and k respectively, and so on for the remainder of the array. In general, all subcells sharing the same row and bit number are placed adjacent to each other, and the horizontal data line accesses all adjacent subcells.

Each of the subcells described above as part of the embodiment of the invention have at least two access ports in order to allow the orthogonal (row and column direction) data access.

The row data lines are coupled to one port of each of the subcells while the column data lines are coupled to a second port of the subcells. Each adjacent pair of subcells having the same row and bit number and different column number have the second port thereof coupled together, e.g. via local horizontal data lines L(1,1)–L(2,4) (each data line is actually a complementary data line pair). Each of the data lines L(1,1)–L(2,4) is coupled to a row data line having sequential identity, i.e. line L(1,1) is coupled to row data line R(0), line L(1,2) is coupled to row data line R(1), line L(1,3) is coupled to row data line R(2), line L(1,4) is coupled to row data line R(3), line L(2,1) is coupled to row data line R(4), line L(2,2) is coupled to row data line R(5), line L(2,3) is coupled to row data bus (R6), and line L(2,4) is coupled to row data line R(7).

Each of the row data lines R(0:7) is coupled to the input of a read amplifier RA(0)–RA(7) for producing data outputs.

Since each of the horizontal data lines L(1,1) . . . L(2,4) is coupled to row data lines, the data read from a column of subcells is transferred to a row data line and thus can be read through the same set of read amplifiers in a similar manner to that explained earlier. Similarly, data placed on a row data line is transferred via a line L to a column of subcells selected via column select lines.

An example of operation follows. Enabling a particular row of subcells consists of enabling all the subcells identified by the row number "a". Enabling a particular column of subcells consists of enabling all subcells identified by the column number "b".

Assume that the array is to be filled with the following data:

0000 0011

1100 1111

This can be done in either of two ways:
(a) 1. Apply 00000011 to the row data lines R(7:0).
2. Enable the first row of subcells. This will write 00000011 into the 8 subcells of the first row.
3. Apply 11001111 to the row data lines R(7:0).
4. Enable the second row of subcells. This will write 11001111 into the 8 subcells of the second row.

Or
(b) 1. Apply 00000011 to the column data lines C(7:0).
2. Enable the first column of subcells. This will write 00000011 into the 8 subcells of the first column via lines L.
3. Apply 11001111 to the column data lines C(7:0).
4. Enable the second column of subcells. This will write 11001111 into the 8 subcells of the second column via lines L.

When reading from the array, this can be done by either of two ways:
(a) 1. Enable the first row of subcells.
2. Read out the bit values stored in the first row of subcells, via read amplifiers RA(0:7), i.e. 00000011.
3. Enable the second row of subcells.
4. Read out the bit values stored in the second row of subcells, via read amplifiers RA(0:7), i.e. 11001111.
Or
(b) 1. Enable the first column of subcells.
2. Read out the bit values stored in the first column of subcells, via lines L onto row data lines and read amplifiers RA(0:7) i.e. 00001100.
3. Enable the second column of subcells.
4. Read out the bit values stored in the second column of subcells, via lines L onto row data lines and read amplifiers RA(0:7), i.e. 00111111.

Thus it will be seen that the same set of sense amplifiers can be used to read from columns as to read from rows. In addition, substantial space is saved in the column (vertical) direction, since it is not necessary to extend column data lines horizontally from one side to the other across the array.

In accordance with another embodiment of the invention, in case it is desired to provide both reading and writing at the same time to two different columns, a set of column data lines C(0:7) can be used, which extend along columns of subcells as shown in FIG. 3. Each subcell is comprised of a third port, which is coupled to an adjacent column data line. By applying data to selected column lines, and by enabling the subcells of a particular column, data can be written to all the subcells of that column. Thus writing can be carried on while reading from another noninterfering column using the data line structure described earlier.

The column data lines C(0:7) can pass parallel to the row data lines, rather than horizontally across the memory, and need only be coupled to corresponding local horizontal data lines L. Thus column data line C(0) is coupled to line L(1,1), column data line C(1) is coupled to line L(1,2), column data line C(2) is coupled to line L(1,3), column data line C(3) is coupled to line L(1,4), column data line C(4) is coupled to line L(2,1), column data line C(5) is coupled to line L(2,2), column data line C(6) is coupled to line L(2,3), and column data line C(7) is coupled to line L(2,4).

Two sets of write drivers 3 and 4 are provided for writing to rows or columns via the row data lines and writing to columns only via the column data lines respectively. To input data to either rows or columns two sets of write drivers are used with two different control enabling signals REN (for row enable) and CEN (for column enable). Both sets of write drivers receive input data from the same input data bus.

Figure 4:
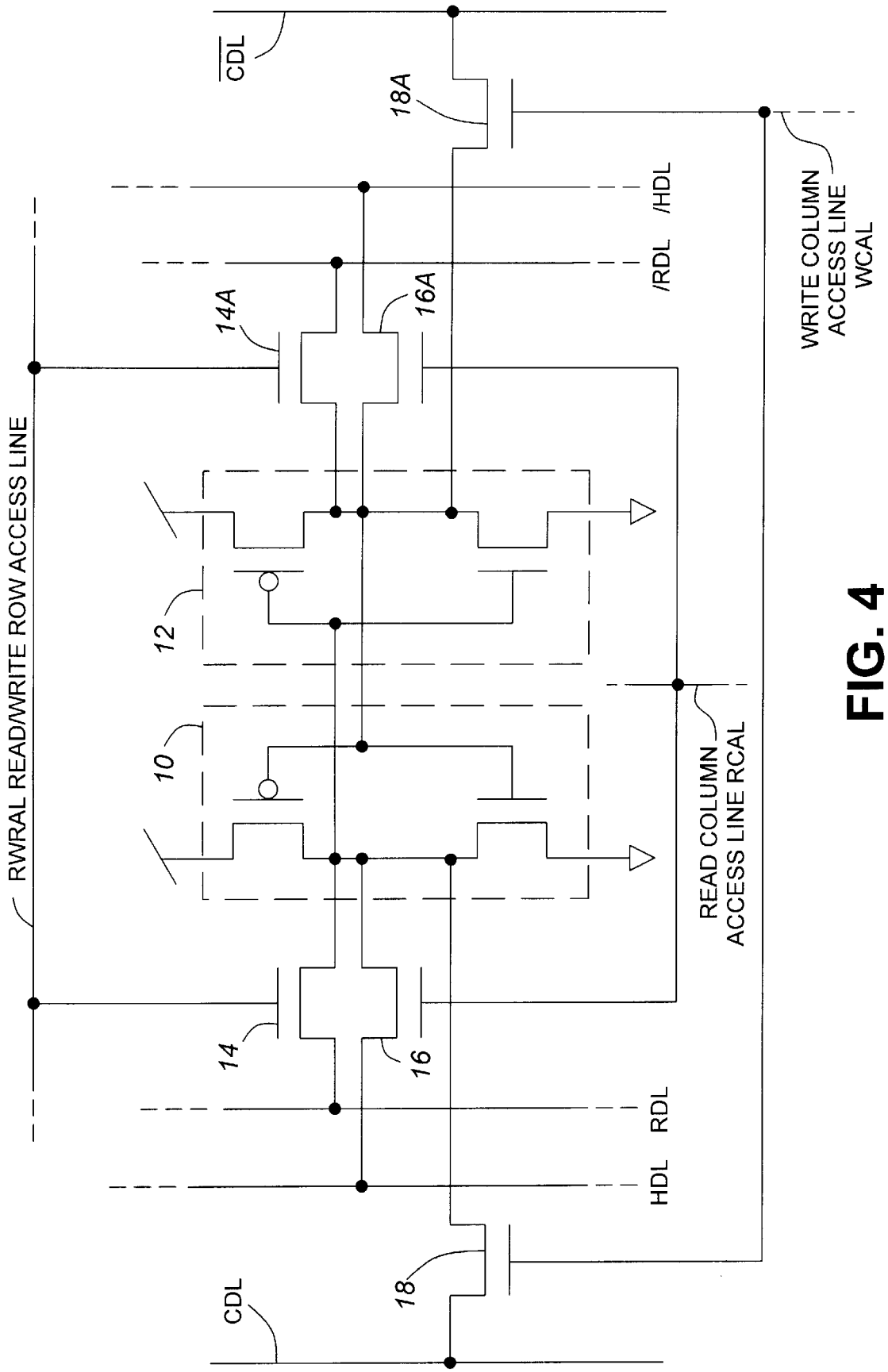
FIG. 4 is a schematic diagram of a three port memory cell or subcell.

The last-described embodiment requires a three port storage cell, an embodiment of which is illustrated in FIG. 4.

Each of two crosscoupled CMOS FET pairs 10 and 12 have their mutual junctions coupled via field effect transistors (FETs) 14 and 16, and 14A and 16A, to complementary row data line RDL and /RDL (forming a first port), and to complementary horizontal data line HDL and /HDL (forming a second port). The gates of the FETs 14 and 14A are coupled to row read/write access line RWRAL, and the gates of the FETs 16 and 16A are coupled to read column access line RCAL. The gates of FETs 18 and 18A are coupled to write column access line WCAL for coupling to the column data lines CDL and/CDL (forming a third port).

In the case of the embodiment in which the column data lines are used, the memory can be written to, and read from different columns at the same time, since the data arrives from, and is read to, two different data lines.

It will be recognized that the reading and writing functions described above are interchangeable. In addition, the invention can be applied to any memory cell matrix which exhibits the problems described above with reference to the prior art A person understanding this invention may now conceive of alternate embodiments and enhancements using the principles described herein. All such embodiments and enhancements are considered to be within the spirit and scope of this invention as defined in the claims appended hereto.

I claim:

1. An integrated circuit data storage array comprising plural storage cells disposed in an array of rows and columns, each cell being comprised of plural subcells, each subcell for storing a bit designated by a row number, a column number and a bit number; subcells of each cell being physically located adjacent each other in positions such that horizontally adjacent subcells differ only in column number and vertically adjacent subcells differ only in row number.

2. A memory as defined in claim 1, in which each said subcell has at least a pair of ports, one of the ports of all subcells having similar column numbers and similar bit numbers being coupled together via a corresponding row data line, and another of the ports of all subcells having similar row numbers and similar bit numbers being coupled together via a corresponding horizontal data line.

3. A memory as defined in claim 2 further including a plurality of column data lines each located parallel to a column of subcells, each said subcell further comprising a third port coupled to an adjacent corresponding one of the plurality of column data lines, each of said subcells receiving select signals for enabling transfer of data between said subcells and corresponding row data lines and column data lines.

4. A memory as defined in claim 3, wherein each horizontal data line is coupled to a corresponding row data line and a corresponding column data line.

5. A memory as defined in claim 4, in which the column data lines are coupled via a write driver to a common bus which also provides data to the row data lines.

6. A memory as defined in claim 2 in which each said subcell is comprised of a memory cell having a plurality of data access ports, and each said subcell having a means receiving select signals for enabling data transfer between said subcell and said data access ports.

7. A data storage array comprising a plurality of storage cells disposed in an array of rows and columns, each storage cell of said plurality of storage cells being comprised of a plurality of subcells, each subcell of said plurality of subcells comprising a single binary bit of stored data designated within said array by a row number, a column number and a bit number, said array further comprising:

(a) a plurality of row data lines coupled to each of said subcells for reading and writing data from and to each of said subcells respectively;

(b) a plurality of horizontal data lines coupled to each of said subcells for reading and writing data from and to each of said subcells respectively;

(c) a plurality of column data lines coupled to each of said subcells for writing data to each of said subcells.

8. A data storage array as defined in claim 7 including means receiving a row select signal for enabling reading and writing data from and to a selected row of subcells via a plurality of row data lines, and means for receiving a column select signal for enabling reading data from a selected column of subcells via said horizontal data lines.

9. A data storage array as defined in claim 7 including means for receiving a first column select signal for enabling writing of data to a first column of subcells via said plurality of column data lines, and means receiving a second column select signal for enabling reading of data from a second column of subcells via said horizontal data lines simultaneously with writing of data to the first column of subcells via said plurality of columns data lines.

10. A method of simultaneously reading and writing different columns of data in an orthogonal storage array comprised of rows and columns of cells wherein each cell in each column is comprised of a plurality of subcells, comprising the following steps:

(a) transferring data from a multi-bit bus to a plurality of single-bit column data lines;

(b) selecting a first column of cells in response to receipt of a first column select signal;

(c) enabling a first data transfer port of each of said subcells within said first column for transferring data from said column data lines to said selected column;

(d) selecting a second column of cells in response to a second column select signal; and (e) enabling a second data access port of each of the subcells within said second column via a plurality of horizontal data lines coupling all subcells within said second column having a similar bit location for transferring data from said horizontal data lines to said row data lines;

steps (b), (c), (d) and (c) being performed substantially simultaneously.

\* \* \* \* \*